(12) United States Patent
Douglas, III

(10) Patent No.: US 6,232,814 B1
(45) Date of Patent: May 15, 2001

(54) METHOD AND APPARATUS FOR CONTROLLING IMPEDANCE ON AN INPUT-OUTPUT NODE OF AN INTEGRATED CIRCUIT

(75) Inventor: Kenneth R. Douglas, III, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/189,541

(22) Filed: Nov. 10, 1998

(51) Int. Cl.[7] ................................................. H03H 11/26
(52) U.S. Cl. ............................................ 327/281; 327/285
(58) Field of Search ................................. 326/30, 86, 87, 326/83, 121, 17, 57, 58; 327/270, 271, 272, 276, 277, 278, 281, 285, 288

(56) References Cited

U.S. PATENT DOCUMENTS 4,719,369 * 1/1988 Asano et al. ......................... 307/443
5,194,765 * 3/1993 Dunlop et al. ....................... 327/112
5,923,183 * 7/1999 Kim et al. ............................. 326/27
5,929,669 * 7/1999 Kim ...................................... 327/112
6,060,907 * 5/2000 Vishwanthaiah et al. ............. 326/87

FOREIGN PATENT DOCUMENTS

404321320 * 11/1992 (JP) ........................... H03K/19/0175

* cited by examiner

Primary Examiner—Toan Tran
Assistant Examiner—Linh Nguyen
(74) Attorney, Agent, or Firm—David J. Kaplan

(57) ABSTRACT

An input-output (I-O) buffer for an I-O node of an integrated circuit. The buffer includes a group of transistors to pull the node up. A shift register has each of two or more of its storage cells coupled to a gate of each of the transistors to control the impedance of the buffer.

7 Claims, 7 Drawing Sheets

METHOD AND APPARATUS FOR CONTROLLING IMPEDANCE ON AN INPUT-OUTPUT NODE OF AN INTEGRATED CIRCUIT

The present invention relates to computer systems and more particularly to an input-output buffer that modifies the input and output impedance on a node of an integrated circuit.

BACKGROUND

Computer systems, from small handheld electronic devices to medium-sized mobile and desktop systems to large servers and workstations, are becoming increasingly pervasive in our society. A typical computer system includes two or more integrated circuits (ICs) affixed to a printed circuit board (PCB). The ICs communicate with one another by sending signals across transmission lines formed on the PCB. For example, one IC may be a processor while one or more other ICs are memory devices that the processor accesses to store and retrieve data. Increasing the speed, or frequency, at which signals are sent across these transmission lines tends to increase the computational power of the computer. Unfortunately, there are electrical properties that limit the signal frequency.

Inductance, resistance, and capacitance on the transmission lines not only limit the frequency but also introduce noise into the signals. Noise may be compensated for by allowing more time for each bit of the signal to settle on the transmission line before the next bit is sent, thereby further reducing signal frequency.

In an effort to overcome some of these limitations, most ICs include input-output (I-O) buffers. An I-O buffer conditions a signal driven to and received from another IC. A typical I-O buffer conditions an output signal generated by the IC by boosting the signal's voltage or current levels before driving the signal on the transmission line. This boosted signal may then be transferred to another IC via the transmission line more cleanly. The I-O buffer may condition an input signal received from another IC via the transmission line by adjusting the signal's voltage or current levels before providing the signal to other circuitry within the IC. The I-O buffer may additionally provide electrostatic discharge protection for the IC.

SUMMARY OF THE INVENTION

An I-O buffer for an integrated circuit and a method for operating the buffer are described. In accordance with one embodiment of the present invention, a buffer for an I-O node includes a group of transistors to pull the node up. A shift register has each of two or more of its storage cells coupled to a gate of each of the transistors to control the impedance of the buffer.

In accordance with another embodiment of the present invention, the buffer further includes a group of transistors to pull the node down. Another shift register has each of two or more of its storage cells coupled to a gate of each of these transistors to control the impedance of the buffer.

Other features and advantages of the present invention will be apparent from the accompanying drawings and the detailed description that follows.

BRIEF DESCRIPTION OF THE DRAWINGS

The present invention is illustrated by way of example and not limitation in the figures of the accompanying drawings in which like references indicate similar elements and in which.

DETAILED DESCRIPTION

Figure 1A:
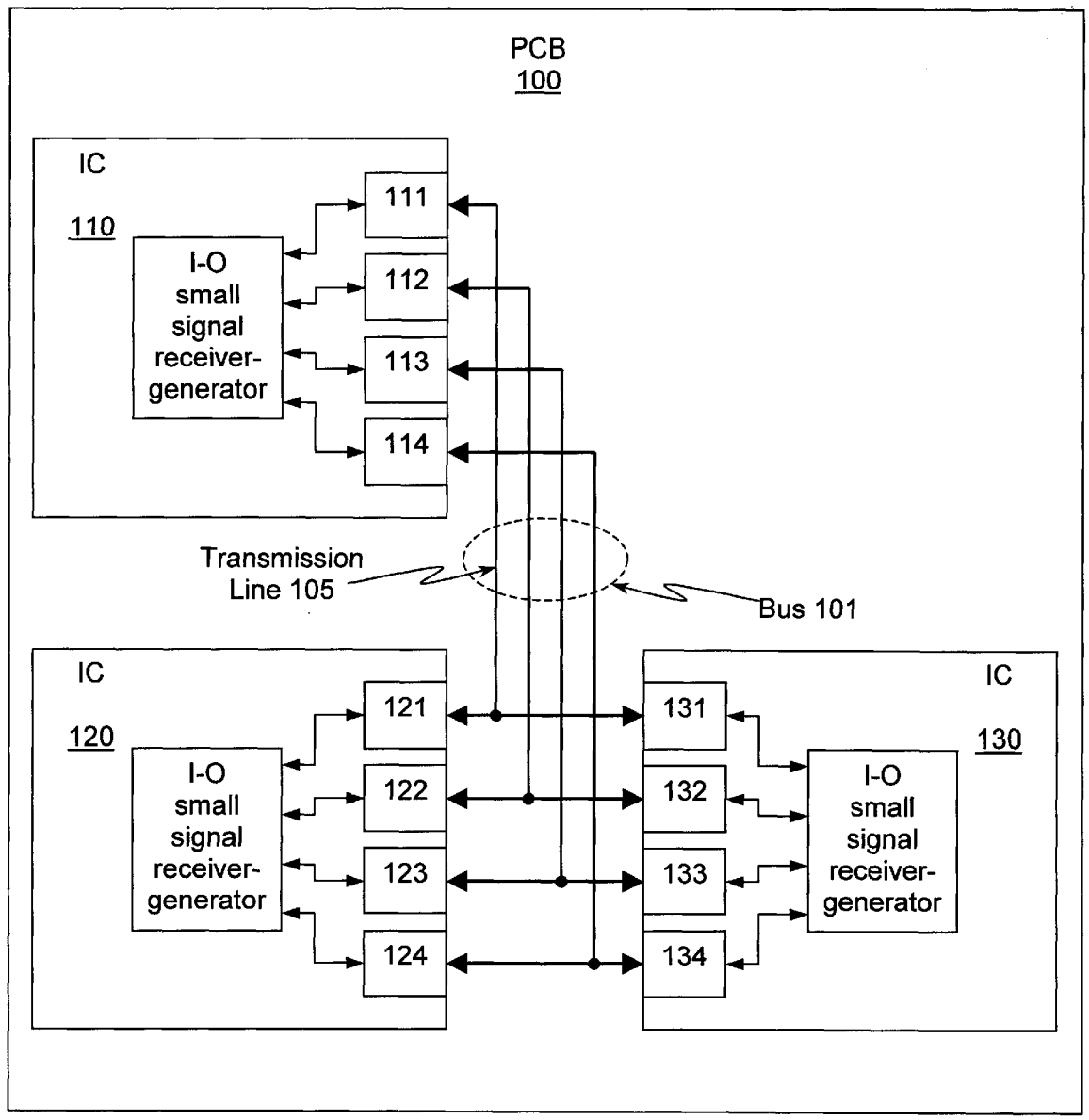
FIG. 1A is a computer system formed in accordance with an embodiment of the present invention.

An input-output (I-O) buffer for an integrated circuit and a method for operating the buffer are described. In accordance with one embodiment of the present invention, one I-O buffer of a first integrated circuit (IC) is coupled to similarly designed I-O buffers of one or more other ICs via a transmission line. Each buffer includes four groups of transistors and a controller. The first group includes p-channel driving transistors configured to drive a high bit on the line by pulling the line up. The second group includes n-channel driving transistors configured to drive low bit on the line by pulling the line down. The third and fourth groups include p-channel and n-channel terminating transistors, respectively, configured to terminate the line by pulling the line up and down simultaneously. The gates of each of the transistors are coupled to a controller.

For the buffer of the first IC to drive a high bit on the transmission line, the controller in the first IC turns on selected p-channel driving transistors and turns off its other groups of transistors. The p-channel driving transistors that are turned on are selected by a first value stored in a first register of the controller to provide a desired output impedance. To drive a low bit on the line, the controller in the first IC turns on selected n-channel driving transistors and turns off its other groups of transistors. The n-channel driving transistors that are turned on are selected by a second value stored in a second register of the controller to provide a desired output impedance.

While the low and high bits of a signal are being driven by the first IC, the controller in one or more of the other ICs coupled to the transmission line turns on selected p-channel and n-channel terminating transistors, simultaneously, to provide a desired input impedance. The p-channel terminating transistors that are turned on are selected by a third value stored in a third register of the other IC's controller, and the n-channel terminating transistors that are turned on are selected by a fourth value stored in a fourth register of the controller.

The output impedances provided by I-O buffers designed in accordance with an embodiment of the present invention are determined by an impedance compensation unit that sets the first and second values in the first and second registers, respectively. The input impedances provided by the I-O buffers are determined by shifting the first and second values by a predetermined number of bits to set the third and fourth values in the third and fourth registers, respectively. The predetermined number of bits is based on the system configuration, including the number of ICs coupled to the transmission line.

The impedances provided by I-O buffers designed in accordance with an embodiment of the present invention dampen signal noise, including, for example, signal overshoot and bounce-back, thereby providing a cleaner signal. This cleaner signal may then be communicated between ICs at higher frequencies. A more detailed description of embodiments of the present invention, including various configurations and implementations, is provided below.

FIG. 1A is a computer system formed in accordance with an embodiment of the present invention in which IC 110, including I-O buffers 111–114, IC 120, including I-O buffers 121–124, and IC 130, including I-O buffers 131–134, are coupled together via bus 101 comprising transmission lines formed on printed circuit board 100. In particular, I-O buffer 111 of IC 110 is coupled to I-O buffers 121 and 131 by transmission line 105 of bus 101. Each of the ICs includes an internal structure in which I-O small signals are received from the I-O buffers, or generated for output to the I-O buffers. These small signals may be stored and manipulated within the IC.

In accordance with one embodiment of the present invention, an IC arbitrates for and wins ownership of a bus. Once ownership is granted to the IC, the I-O buffer of the IC drives a signal (which comprises a sequence of bits) on the transmission lines of the bus to the other ICs while the I-O buffers of the other ICs terminate the line. For example, for one embodiment of the present invention, IC 110 of FIG. 1A is a processor, and ICs 120 and 130 are memory devices that constitute the cache memory for the processor. When the processor sends data to IC 130 for storage, the I-O buffers of IC 110 drive the data onto the transmission lines of bus 101 while the I-O buffers of ICs 120 and 130 terminate the lines. When IC 120 sends data to the processor, the I-O buffers of IC 120 drive the data onto the transmission lines of the bus while the I-O buffers of ICs 110 and 130 terminate the lines. For one embodiment of the present invention, each IC coupled to a transmission line of the bus either drives a signal on the line or, when not driving a signal, terminates the line.

Figure 1B:
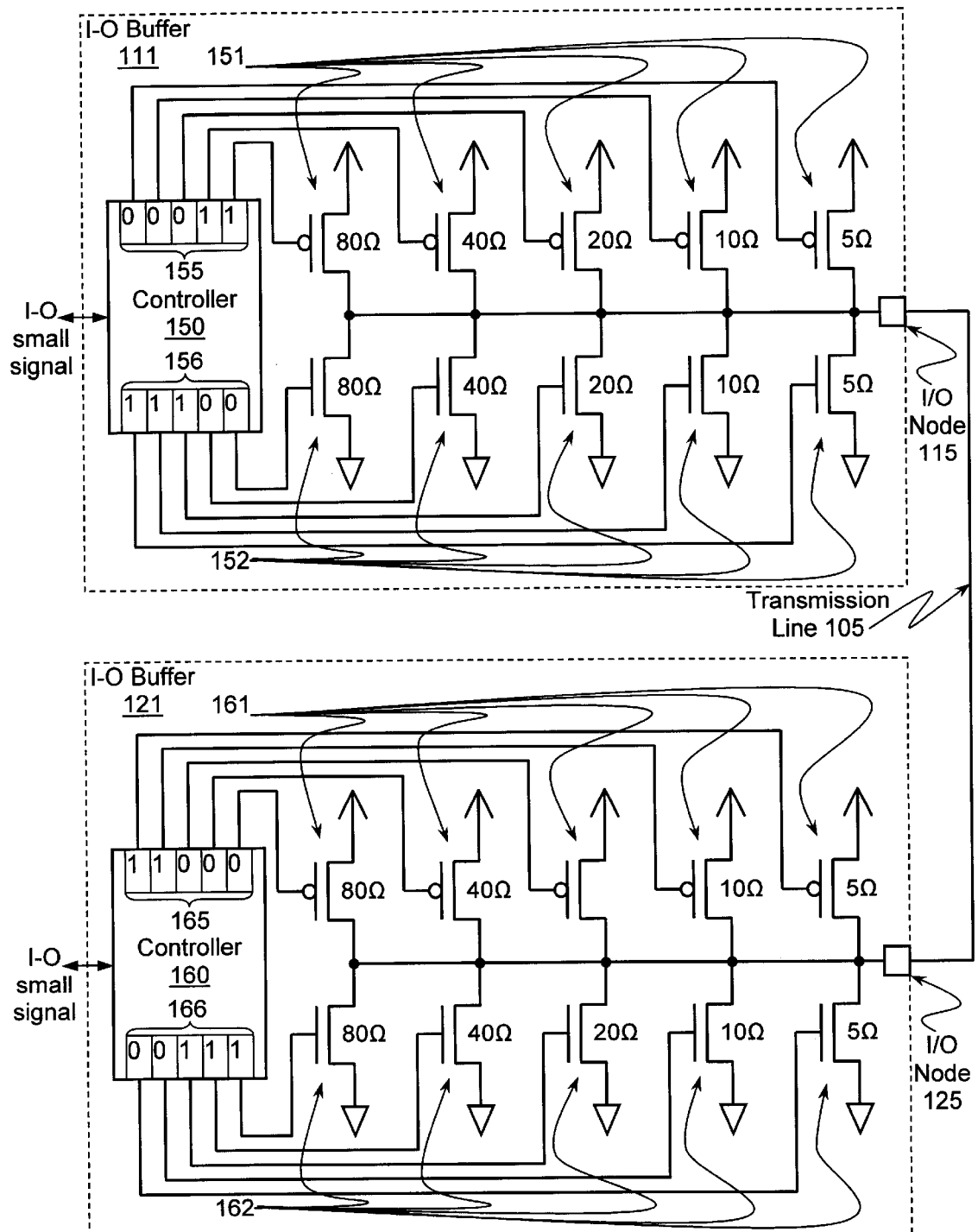
FIG. 1B shows I-O buffers of FIG. 1A during a first mode of operation.

FIG. 1B shows I-O buffers 111 and 121 of FIG. 1A. I-O buffer 111 is the buffer for I-O node 115, and I-O buffer 121 is the buffer for I-O node 125. The buffers are coupled to each other via transmission line 105, which is coupled to the nodes. Buffer 111 includes controller 150 coupled to an I-O small signal line and including shift registers 155 and 156. Each storage cell of register 155 of controller 150 is coupled to a gate of p-channel pull-up transistors 151, and each storage cell of register 156 is coupled to a gate of n-channel pull-down transistors 152. The drains of transistors 151 and 152 are coupled to node 115. Buffer 121 includes controller 160 coupled to an I-O small signal line and including shift registers 165 and 166. Each storage cell of register 165 of controller 160 is coupled to a gate of p-channel pull-up transistors 161, and each storage cell of register 166 is coupled to a gate of n-channel pull-down transistors 162. The drains of transistors 161 and 162 are coupled to node 125. The number of ohms shown beside each transistor is the approximate drain-to-source resistance (or impedance) of that transistor when the transistor is turned on.

For one embodiment, nodes are the I-O ports to the IC and may include contact pads, controlled collapsible chip connect (C4) bumps, bonded wires, solder balls, or pins. In accordance with an alternate embodiment of the present invention, an alternate number of similarly coupled pull-up and pull-down transistors are included in the buffer along with associated storage cells of the controlling registers. For some embodiments, the number of pull-up transistors is different from the number of pull-down transistors. For one embodiment, the transistors are of different widths, providing for different impedances. The widths and numbers of transistors may be selected to strike a desired balance between the size of the buffer, the driving current of the buffer, the input and output impedance of the buffer, and the susceptibility of the buffer to electrostatic discharge (ESD) damage. Note that certain elements of the buffers of FIGS. 1B, 1C, and 2A–C are not shown to avoid obscuring the present invention. For example, for one embodiment, an I-O buffer additionally includes input transistors (the gates of which are coupled to the transmission line) and ESD protection devices.

Initially, consider the operation of the I-O buffers of FIG. 1B when buffer 111 drives a signal on node 115 and buffer 121 terminates node 125. The signal is provided to controller 150 via an I-O small signal line within the IC. Assuming that the first bit of the signal is a high bit, controller 150 turns on a selection of p-channel pull-up transistors 151 and turns off all n-channel pull-down transistors 152. The selection of transistors 151 that is turned on is determined by the value stored in register 155. When the controller turns on a group of transistors, a "0" entered in a storage cell of a register turns on any p-channel transistor having its gate coupled to that storage cell and turns off any n-channel transistor having its gate coupled to that storage cell. Conversely, a "1" entered in a storage cell of a register turns off any p-channel transistors having its gate coupled to that storage cell and turns on any n-channel transistor having its gate coupled to that storage cell. For an alternate embodiment of the present invention, additional logic may be used, such as inverters, to alter this relationship.

When buffer 111 drives a low bit on node 115 FIG. 1B, controller 150 turns on a selection of n-channel pull-down transistors 152 and turns off all of p-channel pull-up transistors 151. The selection of transistors 152 that is turned on is determined by the value stored in register 156. Note that the selection of transistors 152 that is turned on to drive a low bit may be the same or different relative selection as the selection of transistors 151 that is turned on to drive a high bit. In other words, the value stored in register 156 associated with the output impedance when driving a low bit may be the inverse of, the same as, or otherwise different from the value stored in register 155. In addition, the number of bits of the value stored in register 156 may be the same or different than the number of bits of the value stored in register 155.

The values entered in control registers 155 and 156 of FIG. 1B are set to provide the desired driving current and output impedance for buffer 111 in light of manufacturing, voltage, and temperature variation and the configuration of the system in which IC 110 operates. This value may be determined within controller 150 by a hard-wired user setting (e.g. designed into the IC), a ROM setting (e.g. blown fuses or EPROM), a software user setting (e.g. a BIOS command or setup application program), or by an impedance compensation unit that calculates a desired setting based on a voltage or current measurement and sends an appropriate signal to controller 150. As shown, transistors 151 and 152 are of varying widths, resulting in varying impedances, so that a proper selection of transistors can provide an output impedance that is close to the desired output impedance.

When the appropriate selection of transistors 151 of FIG. 1B are turned on, the transistors pull node 115 nearly up to the supply voltage level (e.g. Vcc), to drive the high bit on the node. When the appropriate selection of transistors 152 of FIG. 1B are turned on the transistors pull transmission line 105 nearly down to ground (or Vss), to drive the low bit on the line. This pulling, in turn, pulls transmission line 105 up or down, driving the signal on the line. The signal is driven to all other ICs having I-O buffers coupled to line 105, including IC 120 having buffer 121. Note that the signal being driven may or may not be intended for IC 120. For one embodiment of the present invention, if the signal is not intended for IC 120, the signal is primarily ignored by IC 120 except for, at least, the signaling and driving of the last bit (as described below).

Controller 160 of FIG. 1B turns on a selection of p-channel pull-up transistors 161 as well as a selection of n-channel pull-down transistors 162 to pull transmission line 105 up and down simultaneously. This terminates node 125 and transmission line 105 by providing an input impedance for node 125, and, consequently, buffer 121. As shown, transistors 161 and 162 are of varying widths, resulting in varying impedances, so that a proper selection of transistors can provide an input impedance that is close to the desired input impedance. The desired input impedance is that which adequately dampens signal noise while still providing for adequate signal swing, allowing for higher frequency signal transmission.

Transistor pull strength is determined by the number and widths of transistors pulling on a node. Buffer 121 of FIG. 1B terminates line 105 by pulling the line up and down simultaneously with approximately equal strength such that if transistors 151 were turned off, buffer 121 would drive line 105 to approximately Vcc/2. The selection of transistors 151 and 152 that are turned on to drive a high or low bit, respectively, on transmission line 105 provide a relatively strong pull while the selection of transistors 161 and 162 that are turned on to terminate the line provide a relatively weak pull. Because transistor pull strength is inversely proportional to impedance, it may alternatively be stated that the output impedance of buffer 111 is lower than the input impedance of buffer 121. The proper match between output and input impedances to provide for high signal frequency depends on the number of ICs coupled to the transmission line, system configuration, voltage and current levels, and other electrical characteristics. Note that Transmission line 105 may be additionally terminated by other I-O buffers coupled to the transmission line, such as buffer 131 of IC 130. For an alternate embodiment, other ICs may be coupled to the transmission line with or without providing termination.

For one embodiment of the present invention, the input to output impedance ratio (Zi:Zo) of I-O buffers on a transmission line to which two ICs are coupled is between approximately 1:1 and 3:1. For an embodiment in which three ICs are coupled to the transmission line, the input to output impedance ratio is between approximately 2:1 and 6:1. For an embodiment in which five ICs are coupled to the transmission line, the input to output impedance ratio is between approximately 6:1 and 10:1.

The selection of transistors 161 and 162 of FIG. 1B that is turned on by controller 160 is determined by the values stored in registers 165 and 166. These values are set to provide the desired input impedance for node 125. For one embodiment of the present invention, this selection is determined by shifting the values associated with the desired output impedance of node 125 by a predetermined number of bits, and applying the resulting, shifted value to transistors 161 and 162. In accordance with an embodiment of the present invention, the predetermined number of bits is calculated to provide the proper input to output impedance ratio.

For example, consider the system of FIG. 1A in which three ICs, 110, 120, and 130 are coupled to bus 101. For the embodiment of the present invention described above, the desired input to output impedance ratio is between approximately 2:1 and 6:1, and, ideally, approximately 4:1. The desired output impedance is initially determined in the manner described above in conjunction with controller 150 of FIG. 1B. The controller register values associated with the desired output impedance are shown as stored in register 155 for the pull-up impedance and register 156 for the pull-down impedance. For the embodiment of he present invention of FIGS. 1A–C, this output impedance is similarly determined to be the desired output impedance for buffer 121 as well, and corresponds to the same register values. For an alternate embodiment of the present invention, the desired output impedance for one IC (or node or buffer thereof may be determined to be different than the desired output impedance of another IC coupled to the same transmission line. In addition, the control register values associated with the desired output impedance may be the same or different among different ICs coupled to the same transmission line.

To provide an input to output impedance ratio of approximately 4:1, the values associated with the desired output impedance are shifted by two bits and applied to the gates of the terminating transistors. Note, for example, that the value associated with the desired output impedance for buffer 121 (as shown in registers 155 and 156) are shifted by two bits and entered into registers 165 and 166 of FIG. 1B. Because registers 165 and 166 have a limited number of storage cells, the shift being performed is more specifically a truncated shift, and registers 165 and 166 may be referred to as shift registers. To provide an input to output impedance ratio of approximately 2:1, the values are shifted by one bit and to provide a ratio of approximately 8:1, the values are shifted by three bits. As the values are shifted toward the least significant bits, the least significant bits drop off, providing a truncated, shifted value.

In general, to provide a ratio of approximately 2n:1, the values associated with a desired output impedance are shifted by n bits toward the least significant bit of the control shift register. The driving and terminating transistors are sized such that an impedance of a transistor having a gate coupled to the most significant bit of the control shift register is approximately half the impedance of a transistor coupled to the second most significant bit of the register. The impedance of the transistor coupled to the second most significant bit of the control shift register is approximately half the impedance of a transistor coupled to the third most significant bit of the register. The impedance of the transistor coupled to the third most significant bit of the control shift register is approximately half the impedance of a transistor coupled to the fourth most significant bit of the register, and so forth.

Note, however, that for a finite number of transistors, the ratio of input to output impedance resulting from this shifting method becomes less accurate as the shift distance increases. For example, an upper limit on transistor impedance may be constrained by the smallest (narrowest) transistor that meets ESD requirements for the I-O buffer. For one embodiment of the present invention, the transistors of the I-O buffer are sized to provide acceptable accuracy in the range in which the I-O buffer is anticipated to operate. For example, for an embodiment in which an IC is expected to be coupled to a transmission line that may be coupled to one, two, or four other ICs, the I-O buffer of the IC is designed to provide acceptable input to output impedance ratios for shifts of up to three bits.

For one embodiment of the present invention, the number of bits that the value is shifted with the register of the controller is set by a system designer once it is determined how many ICs are coupled to the transmission line. For an alternate embodiment, the shift distance is hard-wired into the controller or is set by a ROM setting or by software. Alternatively, the shift distance may be automatically calculated by the IC upon detecting the number of ICs to which the IC is coupled or by determining a desired input to output impedance ratio.

Referring again to FIG. 1B, the output impedance of node 115 is determined as follows:

$$1/[(1/5)+(1/10)+(1/20)]=2.9 \text{ ohms}$$

The input impedance of node 125 is determined as follows:

$$1/[(1/20)+(1/40)+(1/80)]=11.4 \text{ ohms}$$

Therefore, the input to output impedance ratio is 11.4/2.9= 3.9, which is approximately the desired ratio of 4:1 and well within the target range of 2:1 to 6:1.

As stated above, buffer 121 of FIG. 1B terminates line 105 by pulling the line up and down simultaneously with approximately equal strength such that if transistors 151 were turned off, buffer 121 would drive line 105 to approximately Vcc/2. Vcc/2 is an indeterminate state, so it may be undesirable to allow this voltage to be applied to the I-O buffers of the ICs coupled to the transmission line. Therefore, in accordance with one embodiment of the present invention, the transmission line that couples the ICs together is always driven either high or low by at least one I-O buffer. In this manner, the tendency of the terminating transistors to drive the transmission line to Vcc/2 is overcome by the driving transistors that drive the transmission line to Vcc or Vss.

For example, consider the operation of the I-O buffers when IC 110 of FIG. 1A nearly completes driving its signal to ICs 120 and 130, and IC 120 is the next IC to gain ownership of bus 101. For one embodiment of the present invention, a handshake between ICs 110 and 120 keeps the transmission lines of bus 101 from being driven to Vcc/2 by the terminating transistors. In this handshake protocol, IC 120 determines when IC 110 is driving the last bit of its signal. IC 120 may make this determination by reading information in the signal off the bus or by receiving a separate side-band signal from IC 110.

While IC 110 of FIG. 1A is driving the last bit in a sequence, IC 120 switches from termination mode to driving mode and simultaneously drives the same bit. The I-O buffers of IC 110 then switch to termination mode and the buffers of IC 120 are allowed to drive bus 101 with a new signal. One or more extra data transfer cycles may be utilized between the driven data sequences to allow simultaneous bus masters to drive the bus with identical values when changing the bus masters. For an alternate embodiment of the present invention, an additional handshake bit or plurality of bits may be inserted between signals sent by the ICs for purposes of implementing this handshake protocol. Note, however, that as used herein, any such additional clock cycle, clock cycle portion, handshake bit, or plurality of bits is defined to be part of the signal that precedes it.

Figure 1C:
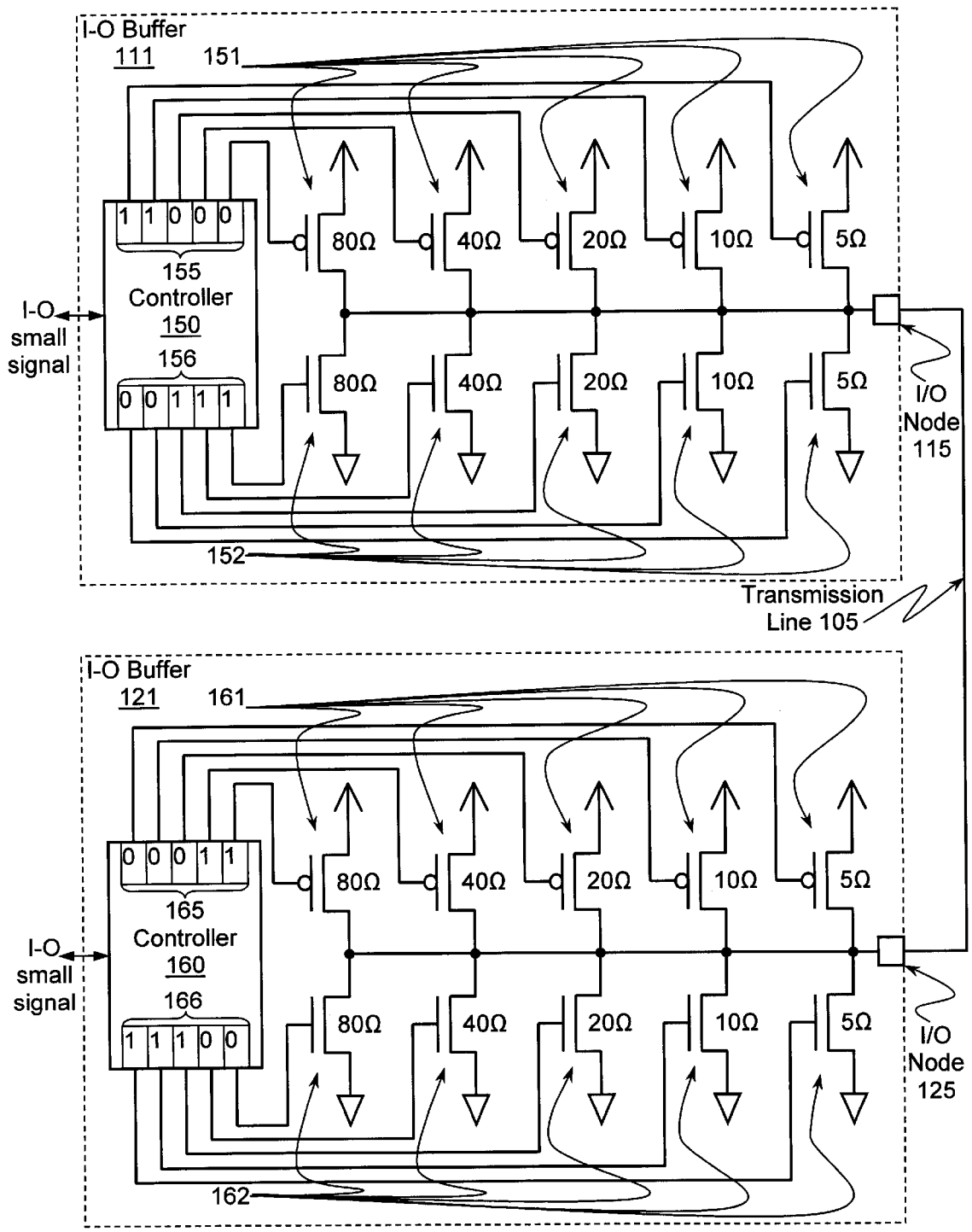
FIG. 1C shows I-O buffers of FIG. 1A during a second mode of operation.

Consider the operation of the I-O buffers of FIG. 1B when buffer 111 of IC 110 switches to termination mode, terminating transmission line 105 of bus 101, after buffer 121 of IC 120 switches to drive mode, driving line 105. First, the values in registers 165 and 166 shift two bits to the right (toward the most significant bit of the shift control registers). Next, the values in registers 155 and 156 shift two bits to the left (toward the least significant bit of the shift control registers). The result is shown in FIG. 1C. Note that the empty storage cells of the registers that are left behind after the values are shifted are back-filled with 1's for a register coupled to p-channel transistors, and with O's for a register coupled to n-channel transistors.

Controller 150 of FIG. 1C turns on a selection of p-channel pull-up transistors 151 as well as a selection of n-channel pull-down transistors 152 to pull transmission line 105 up and down simultaneously according to the values in registers 155 and 156, respectively. The selection of p-channel and n-channel transistors turned on by controller 150 is now different from when buffer 111 drove the signal on transmission line 105. In addition to turning on both p-channel and n-channel transistors simultaneously, the selection of transistors provides for a weaker pull when buffer 111 is terminating the transmission line than when buffer 111 is driving the transmission line. More specifically, if shifting the values in registers 155 and 156 by two bits, buffer 111 provides an input impedance equal to approximately four times its previous output impedance. For one embodiment of the present invention, I-O buffer 111 operates in a manner similar to that described above for I-O buffer 121 in termination mode.

In an alternate embodiment of the present invention, the shifting is accomplished using alternate circuitry. For example, the shifting may be accomplished by a multiplexer rather than the shift register shown in FIGS. 1B and 1C.

Controller 160 of FIG. 1C turns on either a selection of p-channel pull-up transistors 161 or a selection of n-channel pull-down transistors 162 to pull transmission line 105 up or down depending on the signal bit being driven by buffer 121. The selection of p-channel and n-channel transistors turned on by controller 160 is now different from when buffer 121 terminated transmission line 105. In addition to turning on either the p-channel or the n-channel transistors independently, the selection of transistors provides for a stronger pull when buffer 121 is driving the transmission line than when buffer 121 is terminating the transmission line. More specifically, buffer 121 provides an output impedance equal to ¼ its previous input impedance due to the two bit shift of the values in registers 165 and 166. For one embodiment of the present invention, I-O buffer 121 operates in a manner similar to that described above for I-O buffer 111 in signal driving mode.

In accordance with an alternate embodiment of the present invention, one or more pull-down transistors of a buffer driving a high bit remain on, and one or more pull-up transistors of a buffer driving a low bit remain on while the bit is being driven. For example, a selection of one or more pull-down transistors 152 of FIG. 1C may be on while the selection of pull-up transistors 151 are also on, pulling transmission line 105 up to drive a high bit on the line. For this embodiment, the pull-up transistors pull stronger than the pull-down transistors, so line 105 is ultimately pulled up to nearly Vcc. As another example, a selection of one or more pull-up transistors 151 of FIG. 1C may be on while the selection of pull-down transistors 152 are also on, pulling transmission line 105 down to drive a low bit on the line. For this embodiment, the pull-down transistors pull stronger than the pull-up transistors, so line 105 is ultimately pulled down to nearly Vss. Although an I-O buffer may consume more power to drive a signal in this manner, this embodiment may be found useful to help simplify the controller logic or to adjust the impedance to provide a cleaner signal.

Furthermore, the buffers of FIGS. 1B and 1C may include one or more additional pull-up or pull-down transistors (not shown) having gates coupled to alternate controllers (also not shown). These alternate controllers are designed to turn on the one or more additional pull-up transistors when a high bit is driven on the line, and to turn on the one or more additional pull-down transistors when a low bit is driven on the line.

Figure 2A:
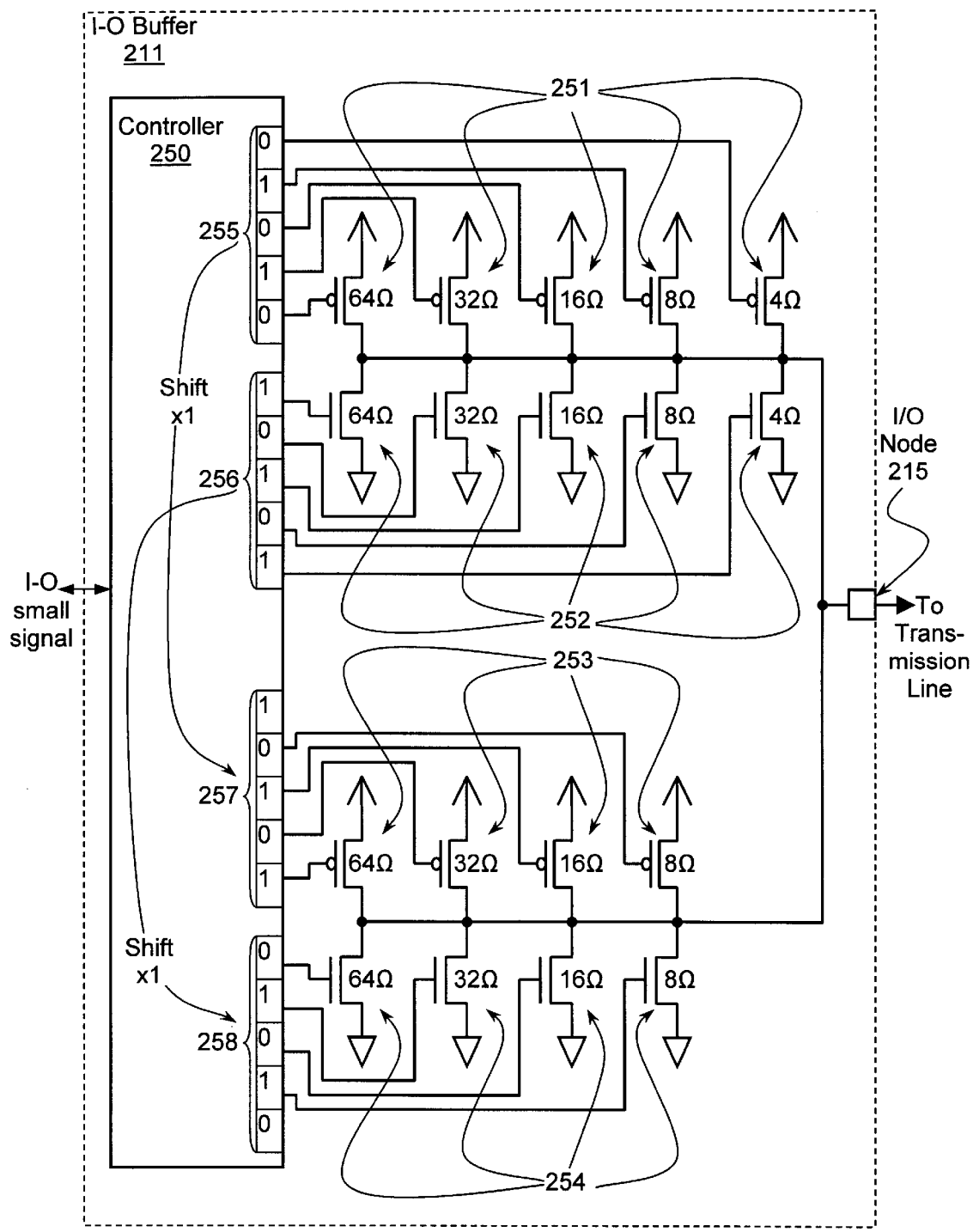
FIG. 2A is an I-O buffer in accordance with another embodiment of the present invention during a first mode of operation.
Figure 2B:
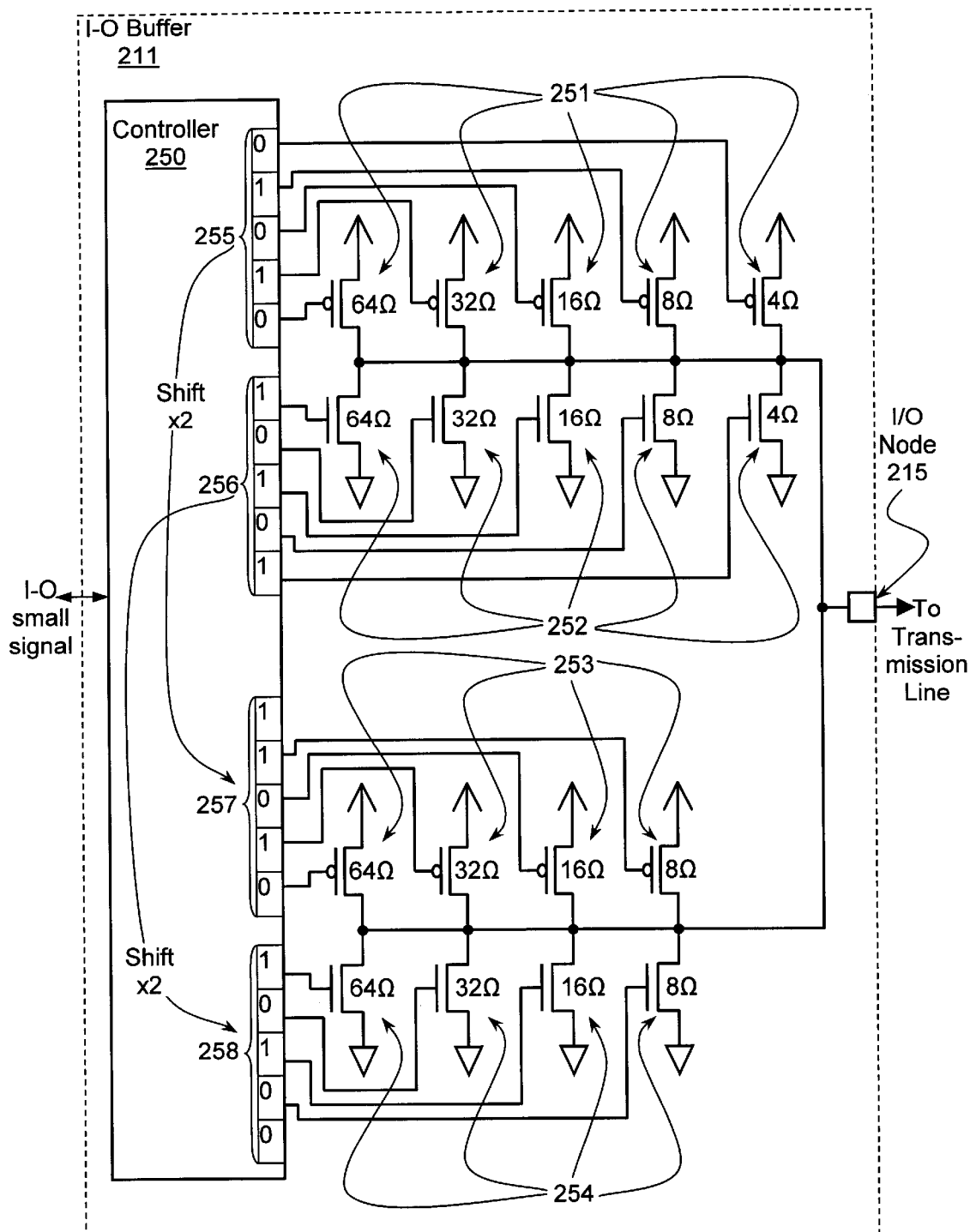
FIG. 2B shows the I-O buffer of FIG. 2A during a second mode of operation.
Figure 2C:
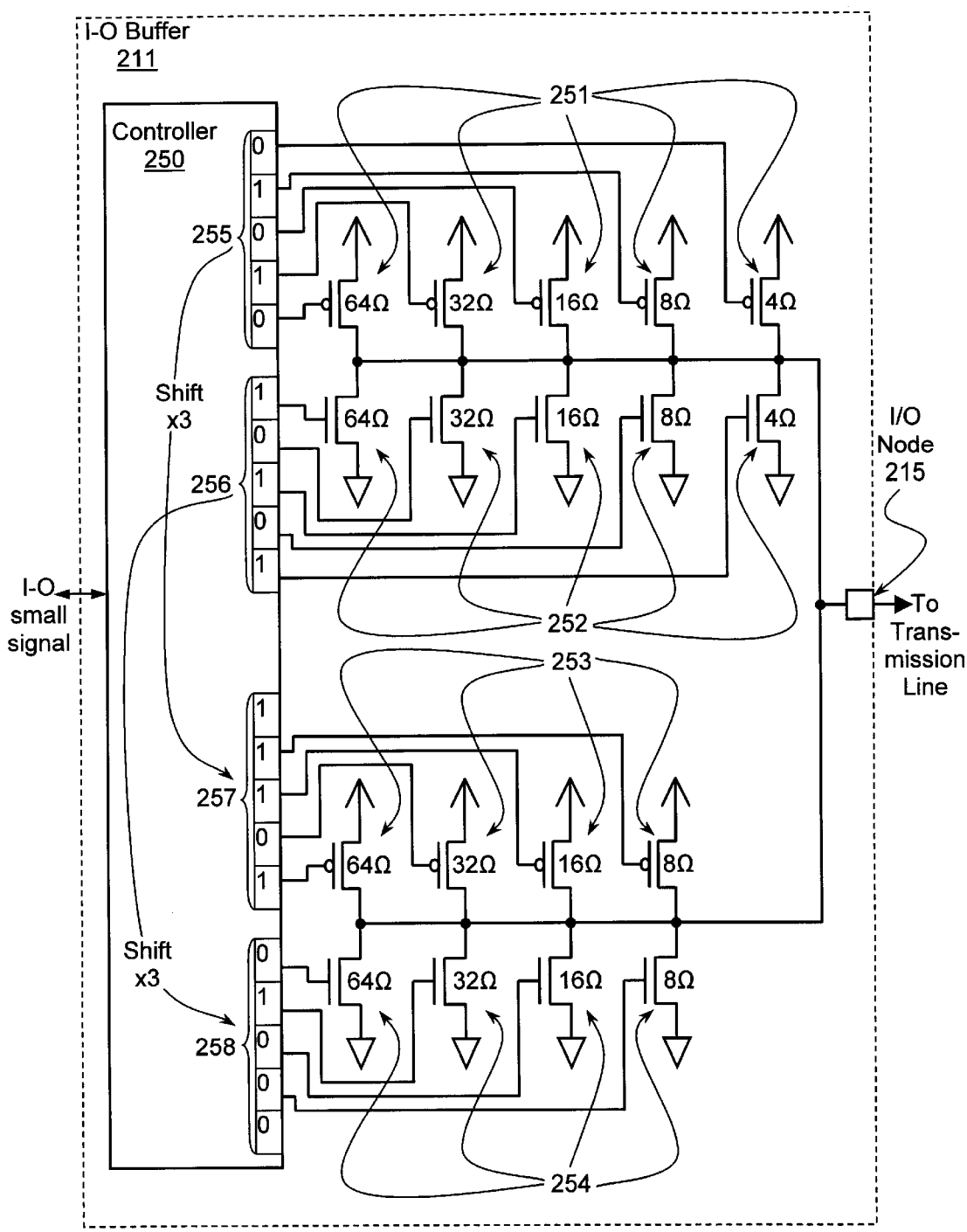
FIG. 2C shows the I-O buffer of FIG. 2A during a third mode of operation.

FIGS. 2A–C show an I-O buffer in accordance with another embodiment of the present invention for different input to output impedance ratio settings. Buffer 211 includes controller 250 coupled to an I-O small signal line and including control registers 255–258. Each storage cell of register 255 of controller 250 is coupled to a gate of a first group of p-channel pull-up transistors 251, and each storage cell of register 257 is coupled to a gate of a second group of p-channel pull-up transistors 253. Each storage cell of register 256 of controller 250 is coupled to a gate of a first group of n-channel pull-down transistors 252, and each storage cell of register 258 is coupled to a gate of a second group of n-channel pull-down transistors 254. The drains of the transistors are coupled to I-O node 215.

Buffer 211 of FIG. 2 operates in a manner similar to buffers 111 and 121 of FIG. 1B. Note, however, that the transistors in the buffers of FIG. 1B operate alternatively as either driving or terminating transistors. That is, the selection of transistors that are turned on to pull a node up or down to drive a signal on a transmission line may overlap the selection of transistors that are turned on to terminate the transmission line. For example, one or more of transistors 151 may operate exclusively as driving transistors and are only turned on by controller 150 to pull up transmission line 115 when buffer 111 drives a high bit on the line. Another one or more of transistors 151 may operate exclusively as terminating transistors and are only turned on, along with a selection of pull-down transistors 152, to terminate the line when buffer 111 is in termination mode. A separate group comprising one or more of transistors 151 may operate alternatively as driving transistors when buffer 111 drives a high bit on line 115, and as terminating transistors when buffer 111 terminates the line.

In contrast, all of the transistors of buffer 211 of FIGS. 2A–C are dedicated to either driving a signal on node 215 or terminating node 215, exclusively. That is, the selection of transistors that are turned on to pull the node up or down to drive a signal on the node does not overlap the selection of transistors that are turned on to terminate the node. Transistors 251 and 252 are dedicated driving transistors, and transistors 253 and 254 are dedicated terminating transistors. Although the selection of transistors 251–254 for driving and for terminating does not overlap for buffer 211, as is true for buffers 111 and 121 of FIGS. 1B and 1C, it is possible for the buffer to overlap in time both driving and terminating functions.

The embodiment of the present invention shown in FIGS. 2A–C may be found advantageous over the embodiment of FIG. 1B because the logic of controller 250 may be made simpler, resulting in a smaller controller size. In accordance with an alternate embodiment of the present invention, the logic of controller 250 may be further simplified by placing a proper selection of transistors 53 and 254 in an always-on state.

When buffer 211 of FIG. 2A drives a high bit on node 215, controller 250 turns on a selection of p-channel pull-up transistors 251 and turns off all other transistors. When buffer 211 drives a low bit on node 215, controller 250 turns on a selection of n-channel pull-down transistors 252 and turns off all other transistors. The selection of transistors 251 and 252 that is turned on is determined by the values in registers 255 and 256, respectively, within the controller as discussed above. As shown, transistors 251 and 252 are of varying widths, resulting in varying impedances, so that a proper selection of transistors can provide an output impedance that is close to the desired output impedance.

When buffer 211 of FIG. 2A is not driving a signal on node 215, the buffer is in termination mode. To terminate node 215, controller 250 turns on a selection of both p-channel pull-up transistors 253 and n-channel pull-down transistors 254. Transistors 251 and 252 are turned off. The selection of transistors 253 and 254 that is turned on is determined by the values in registers 257 and 258, respectively, within the controller as discussed above. As shown, transistors 253 and 254 are of varying widths, resulting in varying impedances, so that a proper selection of transistors can provide an output impedance that is close to the desired output impedance.

For an alternate embodiment of the present invention, the values stored in registers 255 and 256 of FIG. 2A, associated with the output impedance of the buffer, may be the same, inverted from one another (as shown), or otherwise different. Similarly, for an alternate embodiment of the present invention, the values stored in registers 257 and 258, associated with the input impedance of the buffer, may be the same, inverted from one another (as shown), or otherwise different. In addition, an I-O buffer designed in accordance with the embodiment shown in FIG. 2A may include more or fewer driving or terminating transistors, and the transistors may be different sizes and impedances. Note that the large four ohm driving transistors are not duplicated as terminating transistors because the shifting of the values from registers 255 and 256 to registers 257 and 158 ensures that the large transistors would not be turned on anyway.

Buffer 211 of FIG. 2A provides an input to output impedance ratio setting of approximately 2:1. This impedance ratio setting may be found useful for an embodiment in which one other IC having an I-O buffer similar to buffer 211 is coupled to node 215 via the transmission line. Note that the values stored in registers 257 and 258, associated with the input impedance of the node, are equal to the values stored in registers 255 and 256, associated with the output impedance of the node, shifted by one bit (and truncated). The values stored in registers 255 and 256 as well as the number of bits these values are to be shifted to generate the values stored in registers 257 and 258 may be determined as described above in conjunction with FIGS. 1B and 1C. The input impedance is calculated as follows:

$$1/[(1/8)+(1/32)]=6.4 \text{ ohms}$$

The output impedance is calculated as follows:

$$1/[(1/4)+(1/16)+(1/64)]=3.1 \text{ ohms}$$

Therefore, the input to output impedance ratio is 6.4/3.1= 2.1, which is approximately the desired ratio of 2:1.

Buffer 211 of FIG. 2B is the buffer of FIG. 2A set to provide an input to output impedance ratio setting of approximately 4:1. This impedance ratio setting may be found useful for an embodiment similar to FIG. 1A in which two other ICs having an I-O buffer similar to buffer 211 are coupled to node 215 via the transmission line. Note that the values stored in registers 257 and 258, associated with the input impedance of the node, are equal to the values stored in registers 255 and 256, associated with the output impedance of the node, shifted by two bits (and truncated). The output impedance is the same as calculated above, 3.1 ohms. The new input impedance is calculated as follows:

$$1/[(1/16)+(1/64)]=12.8 \text{ ohms}$$

Therefore, the input to output impedance ratio is 12.8/3.1= 4.1, which is approximately the desired ratio of 4:1.

Buffer 211 of FIG. 2C is the buffer of FIG. 2B set to provide an input to output impedance ratio setting of approximately 8:1. This impedance ratio setting may be found useful for an embodiment in which four other ICs having an I-O buffer similar to buffer 211 are coupled to node 215 via the transmission line. Note that the values stored in registers 257 and 258, associated with the input impedance of the node, are equal to the values stored in registers 255 and 256, associated with the output impedance of the node, shifted by three bits (and truncated). The output impedance is the same as calculated above, 3.1 ohms. The new input impedance is 32 ohms. Therefore, the input to output impedance ratio is 32/3.1=10.3, which is approximately the desired ratio of 8:1. Note that the impedance ratio could be made more accurate by modifying the size of the 32 ohm impedance termination transistors.

The flexibility of the shifting scheme of the buffer shown in FIGS. 2A–C is advantageous for providing a number of termination strengths relative to the output buffer strength while maintaining a simple controller design. For example, approximately 16:1 or 32:1 termination strengths are may be made available, in addition to the output impedance ratios of approximately 2:1, 4:1, and 8:1 described above, by allowing further shifting of the output impedance values stored in registers 255 and 256.

Figure 3:
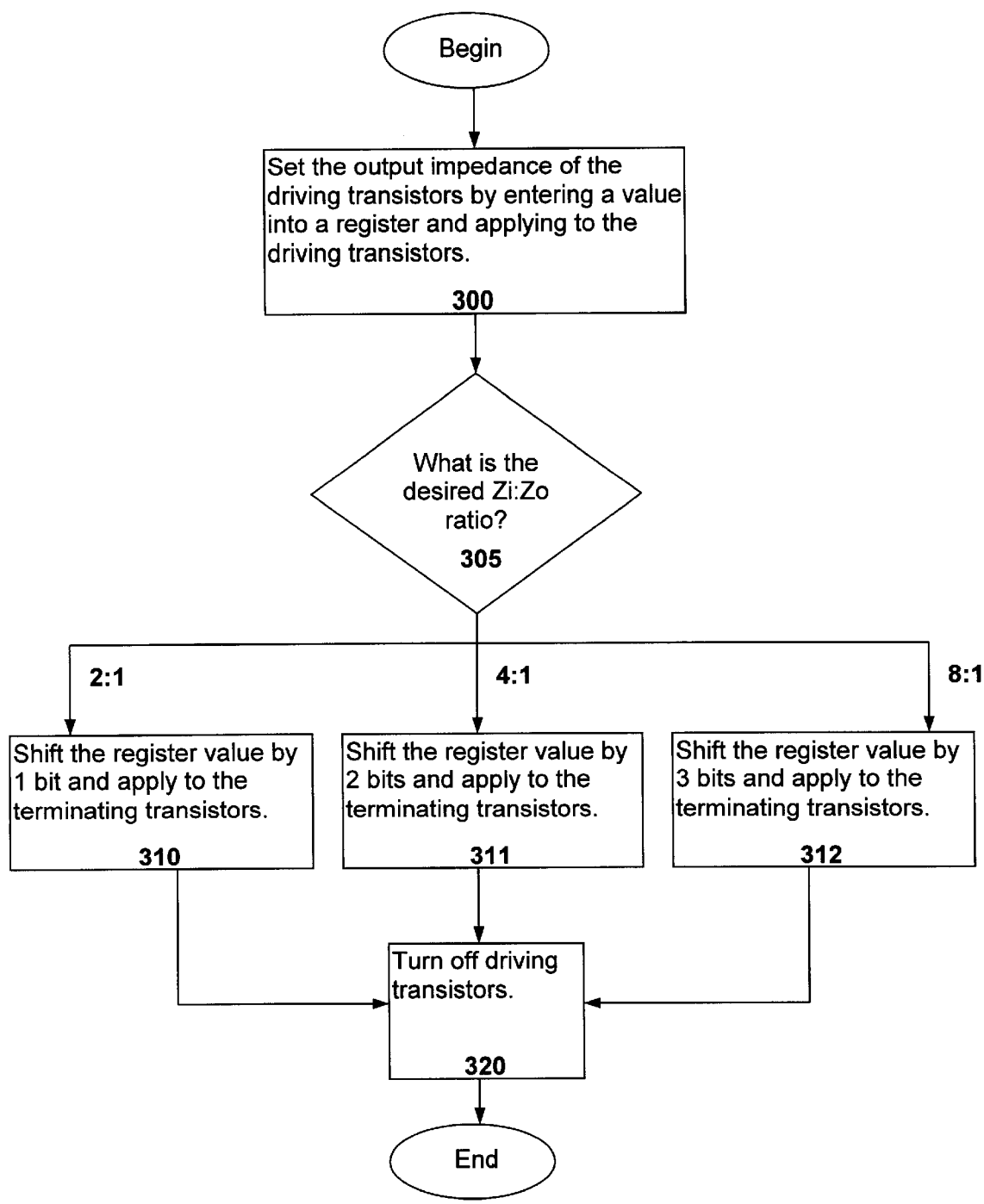
FIG. 3 is a flow chart of a method of the present invention.

FIG. 3 is a flow chart of a method of the present invention. At step 300, the output impedance of the driving transistors is set by entering a value associated with the desired output impedance into a register of the controller. The controller then applies this value to the driving transistors, when appropriate, to drive a signal. The output impedance is determined by turning on an appropriate combination of driving transistors from a set of available transistors in the I-O buffer according to the bits of the value.

At step 305 of FIG. 3, it is determined what the desired input to output impedance ratio is. The desired impedance ratio is determined to be the ratio that provides good signal quality at high frequencies. This ratio is typically dependent on the system configuration, including the number of ICs coupled to a particular transmission line.

If the desired input to output impedance ratio is determined to be approximately 2:1, then process flow proceeds to step 310. At step 310, the value associated with the output impedance that is stored in the register coupled to the driving transistors is shifted by one bit. This shifted value is associated with the input impedance and is stored in the same or a different register, the register being coupled to the termination transistors. Alternatively, the shifted value may be derived using alternate circuitry such as a multiplexer. When a buffer goes into termination mode from driving mode, the shifted value is applied to the termination transistors to provide the desired input impedance.

If the desired input to output impedance ratio is determined to be approximately 4:1, then process flow proceeds to step 311. At step 311, the value associated with the output impedance is shifted by two bits. This shifted value is associated with the input impedance and is applied to the termination transistors to provide the desired input impedance when the buffer goes into termination mode.

If the desired input to output impedance ratio is determined to be approximately 8:1, then process flow proceeds to step 312. At step 312, the value associated with the output impedance is shifted by three bits. This shifted value is associated with the input impedance and is applied to the termination transistors to provide the desired input impedance when the buffer goes into termination mode. For alternate embodiments of the present invention, these or alternate input to output impedance ratios may be achieved by appropriate shifting of the values and sizing of the driving and termination transistors.

After the termination transistors have been turned on, the buffer ceases to drive its output, and, at step 320, the driving transistors are turned off.

This invention has been described with reference to specific exemplary embodiments thereof. It will, however, be evident to persons having the benefit of this disclosure that various modifications and changes may be made to these embodiments without departing from the broader spirit and scope of the invention. The specification and drawings are, accordingly, to be regarded in an illustrative rather than a restrictive sense.

What is claimed is:

1. A method of setting an impedance for an I-O buffer comprising:

setting an output impedance by entering a first value into a first register, the first value controlling a plurality of pull-up driving transistors of the buffer;

performing a truncated shift of the first value to generate a first shifted value; and applying the first shifted value to a plurality of pull-up terminating transistors to set an input impedance.

2. The method of claim 1, further comprising:

setting an output impedance by entering a second value into a second register, the second value controlling a plurality of pull-down driving transistors of the buffer;

performing a truncated shift of the second value to generate a second shifted value; and applying the second shifted value to a plurality of pull-down terminating transistors to set an input impedance.

3. The method of claim 2, wherein applying the first shifted value comprises storing the first shifted value in a third register coupled to the plurality of pull-up terminating transistors, and applying the second shifted value comprises storing the second shifted value in a fourth register coupled to the plurality of pull-up terminating transistors.

4. The method of claim 1, wherein applying the first shifted value comprises storing the first shifted value in the first register, the first register being coupled to both the plurality of pull-up driving transistors and the plurality of pull-up terminating transistors.

5. The method of claim 1, wherein performing the truncated shift includes shifting the first value by three bits to set an input impedance that is in the range of approximately ⅒ to ⅙ of the output impedance.

6. The method of claim 5, wherein performing the truncated shift includes shifting the first value by two bits to set an input impedance that is in the range of approximately ½ to ⅙ of the output impedance.

7. The method of claim 6, wherein performing the truncated shift includes shifting the first value by two bits if the I-O buffer is coupled to two similarly designed I-O buffers, and shifting the first value by three bits if the I-O buffer is coupled to four similarly designed I-O buffers.

* * * * *